(12) United States Patent
Takeda et al.

(10) Patent No.: US 12,400,840 B2
(45) Date of Patent: Aug. 26, 2025

(54) SUBSTRATE PROCESSING APPARATUS, SUBSTRATE HOLDER, AND METHOD OF MANUFACTURING SEMICONDUCTOR DEVICE

(71) Applicant: Kokusai Electric Corporation, Tokyo (JP)

(72) Inventors: Tsuyoshi Takeda, Toyama (JP); Daisuke Hara, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 108 days.

(21) Appl. No.: 18/164,085

(22) Filed: Feb. 3, 2023

(65) Prior Publication Data

US 2023/0187188 A1    Jun. 15, 2023

Related U.S. Application Data

(63) Continuation of application No. PCT/JP2021/030414, filed on Aug. 19, 2021.

(30) Foreign Application Priority Data

Aug. 26, 2020    (JP) ................ 2020-142605

(51) Int. Cl.
    *H01J 37/32*    (2006.01)
    *C23C 16/458*   (2006.01)
    *C23C 16/52*    (2006.01)

(52) U.S. Cl.
    CPC .... *H01J 37/32724* (2013.01); *C23C 16/4588* (2013.01); *C23C 16/52* (2013.01);
    (Continued)

(58) Field of Classification Search
    CPC .......... H01J 37/32724; H01J 37/32449; H01J 37/32568; H01J 2237/3323;
    (Continued)

(56) References Cited

U.S. PATENT DOCUMENTS

| 4,381,965 A | * | 5/1983 | Maher, Jr. | ......... H01J 37/32568 |
| | | | | 156/345.47 |
| 4,633,811 A | * | 1/1987 | Maruyama | ............. C23C 16/52 |
| | | | | 118/50.1 |

(Continued)

FOREIGN PATENT DOCUMENTS

| JP | 02-303029 A | 12/1990 |
| JP | H02-303029 A | 12/1990 |

(Continued)

OTHER PUBLICATIONS

Taiwan Office Action, TW Patent Application No. 110126906, Jun. 8, 2022, 12 pgs.

(Continued)

*Primary Examiner* — Rudy Zervigon
(74) *Attorney, Agent, or Firm* — Volpe Koenig

(57) ABSTRACT

There is provided a technique that includes: a process chamber that processes a plurality of substrates; a substrate holder on which the plurality of substrates is supported; an electrode that forms plasma in the process chamber, and auxiliary plate that is disposed between the plurality of substrates and assists formation of the plasma.

18 Claims, 8 Drawing Sheets

(52) U.S. Cl.
CPC ............... *H01J 37/32449* (2013.01); *H01J 37/32568* (2013.01); *H01J 2237/3323* (2013.01)

(58) Field of Classification Search
CPC ........... H01J 37/32009; H01J 37/32091; H01J 37/32715; H01J 37/32798; H01J 37/3244; H01J 37/32532; H01J 15/00; H01J 37/32082; H01J 37/32623; C23C 16/4588; C23C 16/52; C23C 16/45536; C23C 16/45546; C23C 16/4586; C23C 16/46; C23C 16/507; C23C 16/509; C23C 16/5096; C23C 16/45565; H01L 21/31; H01L 21/67069; H05H 1/46
USPC ..... 118/723 E, 723 ER; 156/345.43, 345.44, 156/345.45; 219/600
See application file for complete search history.

(56) References Cited

U.S. PATENT DOCUMENTS

| | | | | |
|---|---|---|---|---|
| 5,015,330 | A * | 5/1991 | Okumura | H01J 37/32357 156/917 |
| 5,383,984 | A * | 1/1995 | Shimada | H01L 21/67109 156/345.43 |
| 7,718,919 | B2 * | 5/2010 | Machado | H01J 37/32532 219/121.52 |
| 7,958,842 | B2 | 6/2011 | Ogawa et al. | |
| 8,518,182 | B2 | 8/2013 | Ogawa et al. | |
| 10,796,934 | B2 * | 10/2020 | Takeda | C23C 16/45523 |
| 11,380,563 | B2 * | 7/2022 | Takeda | H01L 21/67017 |
| 12,094,735 | B2 * | 9/2024 | Takeda | H01J 37/32449 |
| 2007/0292556 | A1 * | 12/2007 | Machado | H01J 37/32532 425/556 |
| 2020/0083067 | A1 | 3/2020 | Takeda et al. | |
| 2021/0151302 | A1 * | 5/2021 | Schlemm | C23C 16/509 |

FOREIGN PATENT DOCUMENTS

| | | | |
|---|---|---|---|
| JP | 2007-258504 | A | 10/2007 |
| JP | 2008-270477 | A | 11/2008 |
| JP | 2009-010018 | A | 1/2009 |
| JP | 5137903 | B2 | 2/2013 |
| JP | 2015-005475 | A | 1/2015 |
| JP | 2015-005634 | A | 1/2015 |
| JP | 2017-027985 | A | 2/2017 |
| JP | 2020-043221 | A | 3/2020 |
| WO | 2014/203719 | A1 | 12/2014 |
| WO | 2018/055700 | A1 | 3/2018 |

OTHER PUBLICATIONS

International Search Report, PCT/JP2021/030414, Sep. 28, 2021, 3 pgs.
Korean Office Action issued on Sep. 5, 2024 for Korean Patent Application No. 10-2022-7041234.

* cited by examiner

SUBSTRATE PROCESSING APPARATUS, SUBSTRATE HOLDER, AND METHOD OF MANUFACTURING SEMICONDUCTOR DEVICE

CROSS-REFERENCE TO RELATED APPLICATIONS

This application is a Bypass Continuation Application of PCT International Application No. PCT/JP2021/030414, filed on Aug. 19, 2021, the disclosure of which is incorporated herein in its entirety by reference.

BACKGROUND

Field

The present disclosure relates to a substrate processing apparatus, a substrate holder, and a method of manufacturing a semiconductor device.

Description of the Related Art

As one step of a process of manufacturing a semiconductor device (device), substrate processing may be performed in which a substrate is loaded into a process chamber of a substrate processing apparatus, and a source gas and a reactant gas are supplied into the process chamber to form various films such as an insulating film, a semiconductor film, and a conductor film on the substrate or to remove the various films.

In a mass production device in which a fine pattern is formed, a low temperature is required in order to suppress diffusion of impurities and to enable use of a material having low heat resistance, such as an organic material.

SUMMARY

In order to solve such a problem, substrate processing is generally performed using plasma. When the surface area of a substrate to be processed is significantly increased, the supply amount of active species such as ions and radicals generated by the plasma is insufficient with respect to a required amount. Therefore, in a center portion of the substrate, processing ability is deteriorated, that is, it may be difficult to uniformly perform processing on the substrate.

An object of the present disclosure is to provide a technique capable of improving uniformity of substrate processing.

According to embodiments of the present disclosure, there is provided a technique, which includes:
a process chamber configured to process a plurality of substrates; a substrate holder on which the plurality of substrates are supported; an electrode configured to form plasma in the process chamber; and auxiliary plate disposed between the plurality of substrates and configured to assist formation of the plasma.

DETAILED DESCRIPTION

Embodiment of the Present Disclosure

Hereinafter, an embodiment of the present disclosure will be described with reference to FIGS. 1 to 8.

(1) Configuration of Substrate Processing Apparatus (Heating Device)

Figure 1:
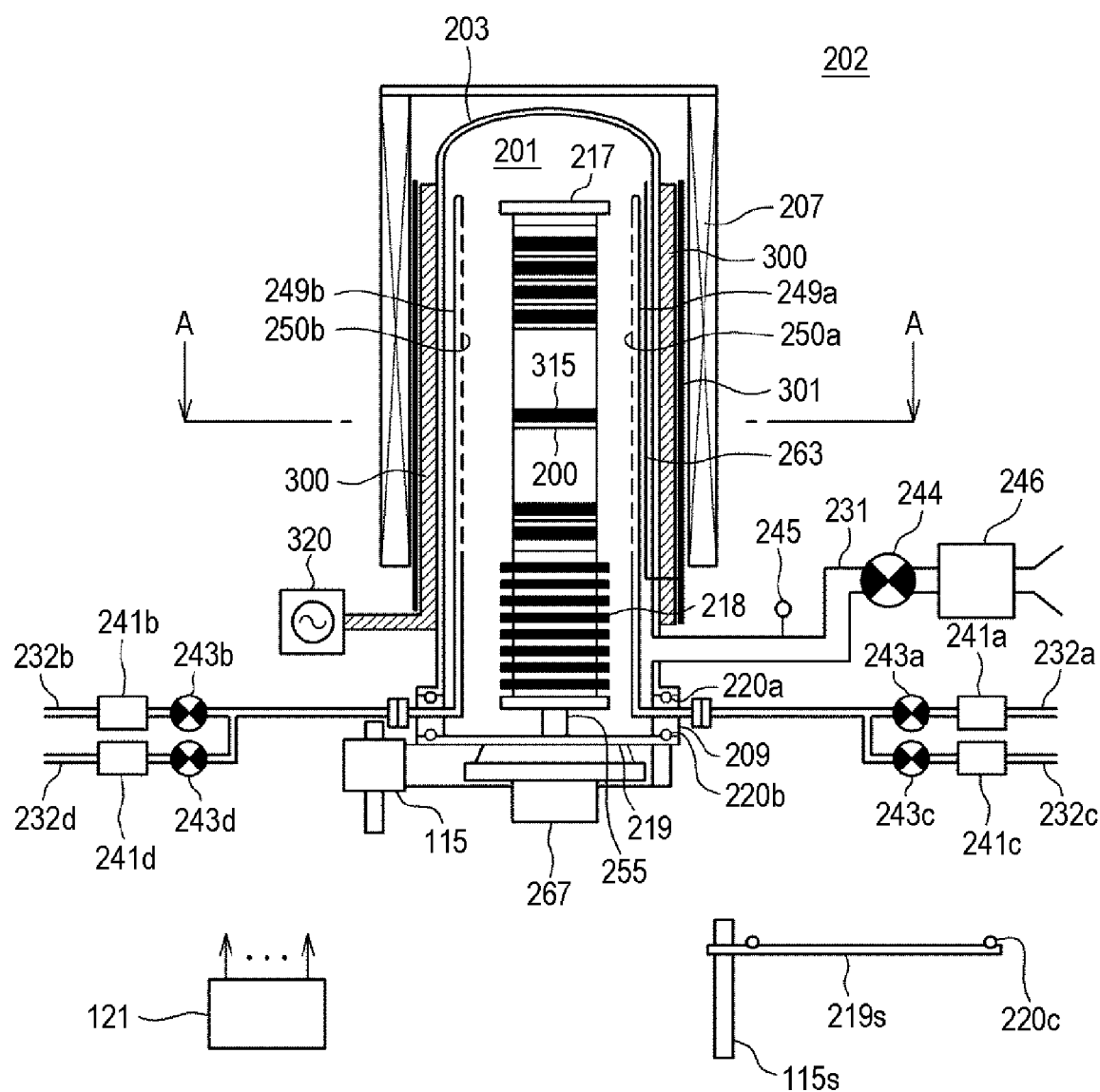
FIG. 1 is a schematic configuration diagram of a vertical process furnace of a substrate processing apparatus preferably used in an embodiment of the present disclosure, and illustrates a process furnace portion in a vertical cross section.

As illustrated in FIG. 1, a process furnace 202 includes a heater 207 serving as a heating device (heater). The heater 207 has a cylindrical shape, and is vertically installed by being supported by a heater base (not illustrated) serving as a holding plate. The heater 207 also functions as an activation mechanism (exciter) to activate (excite) a gas with heat as described later.

(Process Chamber)

Inside the heater 207, a quartz cover 301 serving as an external electrode fixing jig described later is disposed, and inside the quartz cover 301. Furthermore, an external electrode 300 of a plasma generator described later is disposed. Furthermore, inside the external electrode 300, a reaction tube 203 is disposed concentrically with the heater 207. The reaction tube 203 is made of, for example, a heat-resistant material such as quartz ($SiO_2$), silicon carbide (SiC), or silicon nitride (SiN), and is formed in a cylindrical shape having an upper end closed and a lower end opened. Below the reaction tube 203, a manifold 209 is disposed concentrically with the reaction tube 203. For example, the manifold 209 is made of metal, such as stainless steel (SUS), and is formed in a cylindrical shape having an upper end a lower end opened. An upper end portion of the manifold 209 is engaged with a lower end portion of the reaction tube 203 and is configured to support the reaction tube 203. Between the manifold 209 and the reaction tube 203, an O-ring 220a serving as a seal member is disposed. When the manifold 209 is supported by the heater base, the reaction tube 203 is vertically installed. A process container (reaction container)

is mainly configured by the reaction tube 203 and the manifold 209. A process chamber 201 is formed in a cylindrical hollow portion of the process container. The process chamber 201 is configured to be able to house wafers 200 serving as a plurality of substrates and a plurality of auxiliary plates 315 described later, and the wafers 200 and the auxiliary plates 315 are alternately disposed. In other words, the auxiliary plates 315 are disposed between the plurality of wafers 200. The auxiliary plate 315 is preferably disposed above each of the plurality of wafers 200. Note that the process container is not limited to one having the above configuration, and only the reaction tube 203 may be referred to as a process container.

(Gas Supplier)

In the process chamber 201, nozzles 249a and 249b are disposed so as to penetrate a side wall of the manifold 209. To the nozzles 249a and 249b, gas supply pipes 232a and 232b are connected, respectively. As described above, in the process container, the two nozzles 249a and 249b and the two gas supply pipes 232a and 232b are disposed such that a plurality of types of gases can be supplied into the process chamber 201. Note that when only the reaction tube 203 is used as the process container, the nozzles 249a and 249b may be disposed so as to penetrate a side wall of the reaction tube 203.

In the gas supply pipes 232a and 232b, mass flow controllers (MFC) 241a and 241b that are flow rate controllers and valves 243a and 243b that are on-off valves are disposed in this order from an upstream side, respectively. To the gas supply pipes 232a and 232b on downstream sides of the valves 243a and 243b, gas supply pipes 232c and 232d that supply inert gases are connected, respectively. In the gas supply pipes 232c and 232d, MFCs 241c and 241d and valves 243c and 243d are disposed in this order from an upstream side, respectively.

The nozzles 249a and 249b are disposed in an annular space in plan view between an inner wall of the reaction tube 203 and the wafers 200 so as to rise upward in a stacking direction of the wafers 200 from a lower portion of the inner wall of the reaction tube 203 to an upper portion thereof along the inner wall. That is, the nozzles 249a and 249b are disposed perpendicularly to surfaces (flat surfaces) of the wafers 200 loaded into the process chamber 201 on a lateral side of end portions (peripheral edge portions) of the wafers 200. On side surfaces of the nozzles 249a and 249b, gas supply holes 250a and 250b through which a gas is supplied are formed, respectively. The gas supply hole 250a opens so as to face the center of the reaction tube 203, and can supply a gas toward the wafers 200. A plurality of the gas supply holes 250a and a plurality of the gas supply holes 250b are formed from a lower portion of the reaction tube 203 to an upper portion thereof.

As described above, in the present embodiment, a gas is transferred via the nozzles 249a and 249b disposed in an annular and longitudinally long space in plan view, defined by an inner wall of a side wall of the reaction tube 203 and end portions (peripheral edge portions) of the plurality of wafers 200 arranged in the reaction tube 203, that is, in a cylindrical space. A gas is ejected into the reaction tube 203 for the first time in the vicinity of the wafers 200 from the gas supply holes 250a and 250b opened in the nozzles 249a and 249b, respectively. A main flow of a gas in the reaction tube 203 is a direction parallel to surfaces of the wafers 200, that is, a horizontal direction. With such a configuration, a gas can be uniformly supplied to the wafers 200, and uniformity of the film thicknesses of the films formed on the wafers 200 can be improved. A gas that has flowed on the surfaces of the wafers 200, that is, a residual gas after a reaction flows toward an exhaust port, that is, an exhaust pipe 231 described later. Note that the flow direction of the residual gas is appropriately specified by the position of the exhaust port, and is not limited to the vertical direction.

As a source containing a predetermined element, for example, a silane source gas containing silicon (Si) serving as the predetermined element is supplied from the gas supply pipe 232a into the process chamber 201 via the MFC 241a, the valve 243a, and the nozzle 249a.

The silane source gas is a silane source in a gaseous state, for example, a gas obtained by vaporizing a silane source in a liquid state under normal temperature and normal pressure or a silane source in a gaseous state under normal temperature and normal pressure. In the present specification, when the term "source" is used, the term may mean "a liquid source in a liquid state", "a source gas in a gaseous state", or both of these.

As the silane source gas, for example, a source gas containing Si and an amino group (amine group), that is, an aminosilane source gas can be used. The aminosilane source is a silane source having an amino group, is also a silane source having an alkyl group such as a methyl group, an ethyl group, or a butyl group, and is a source containing at least Si, nitrogen (N), and carbon (C). That is, the aminosilane source referred to herein can be said to be an organic source or an organic aminosilane source.

As the aminosilane source gas, for example, a bis-tertiary butylaminosilane ($SiH_2[NH(C_4H_9)]_2$, abbreviation: BTBAS) gas can be used. It can also be said that BTBAS is a source gas containing one Si in one molecule, having a Si—N bond and an N—C bond, and having no Si—C bond. The BTBAS gas acts as a Si source.

When a liquid source in a liquid state under normal temperature and normal pressure like BTBAS is used, the source in a liquid state is vaporized by a vaporization system such as a vaporizer or a bubbler and supplied as silane source gas (BTBAS gas or the like).

As a reactant having a chemical structure different from that of the source, for example, an oxygen (O)-containing gas is supplied from the gas supply pipe 232b into the process chamber 201 via the MFC 241b, the valve 243b, and the nozzle 249b.

The O-containing gas acts as an oxidizing agent (oxidizing gas), that is, an O source. As the O-containing gas, for example, an oxygen ($O_2$) gas or water vapor ($H_2O$ gas) can be used. When an $O_2$ gas is used as an oxidizing agent, for example, this gas is plasma-excited using a plasma source described later, and is supplied as an excitation gas ($O_2^*$ gas).

As an inert gas, for example, a nitrogen ($N_2$) gas is supplied from the gas supply pipes 232c and 232d into the process chamber 201 via the MFCs 241c and 241d, the valves 243c and 243d, and the nozzles 249a and 249b, respectively.

A source supply system serving as a first gas supply system is mainly configured by the gas supply pipe 232a, the MFC 241a, and the valve 243a. A reactant supply system serving as a second gas supply system is mainly configured by the gas supply pipe 232b, the MFC 241b, and the valve 243b. An inert gas supply system is mainly configured by the gas supply pipes 232c and 232d, the MFCs 241c and 241d, and the valves 243c and 243d. The source supply system, the reactant supply system, and the inert gas supply system are also simply referred to as a gas supply system (gas supplier).

(Substrate Holder)

As illustrated in FIG. 1, a boat 217 serving as a substrate holder is configured to support a plurality of, for example, 25 to 200 wafers 200 and a plurality of auxiliary plates 315 in multiple stages while the wafers 200 and the auxiliary plates 315 are arranged in the vertical direction in a horizontal posture and in a state where the centers thereof are aligned with each other, that is, such that the wafers 200 and the auxiliary plates 315 are arranged at intervals. The boat 217 is made of, for example, a heat-resistant material such as quartz or SiC. In a lower portion of the boat 217, heat insulating plates 218 made of, for example, a heat-resistant material such as quartz or SiC are supported in multiple stage. With this configuration, heat from the heater 207 is less likely to be transferred to a seal cap 219 side. Note that the present embodiment is not limited to such a form. For example, a heat insulating tube configured as a cylindrical member made of a heat-resistant material such as quartz or SiC may be disposed without disposing the heat insulating plates 218 in the lower portion of the boat 217.

(Plasma Generator)

Next, a plasma generator will be described with reference to FIGS. 1 to 5B.

Figure 2:
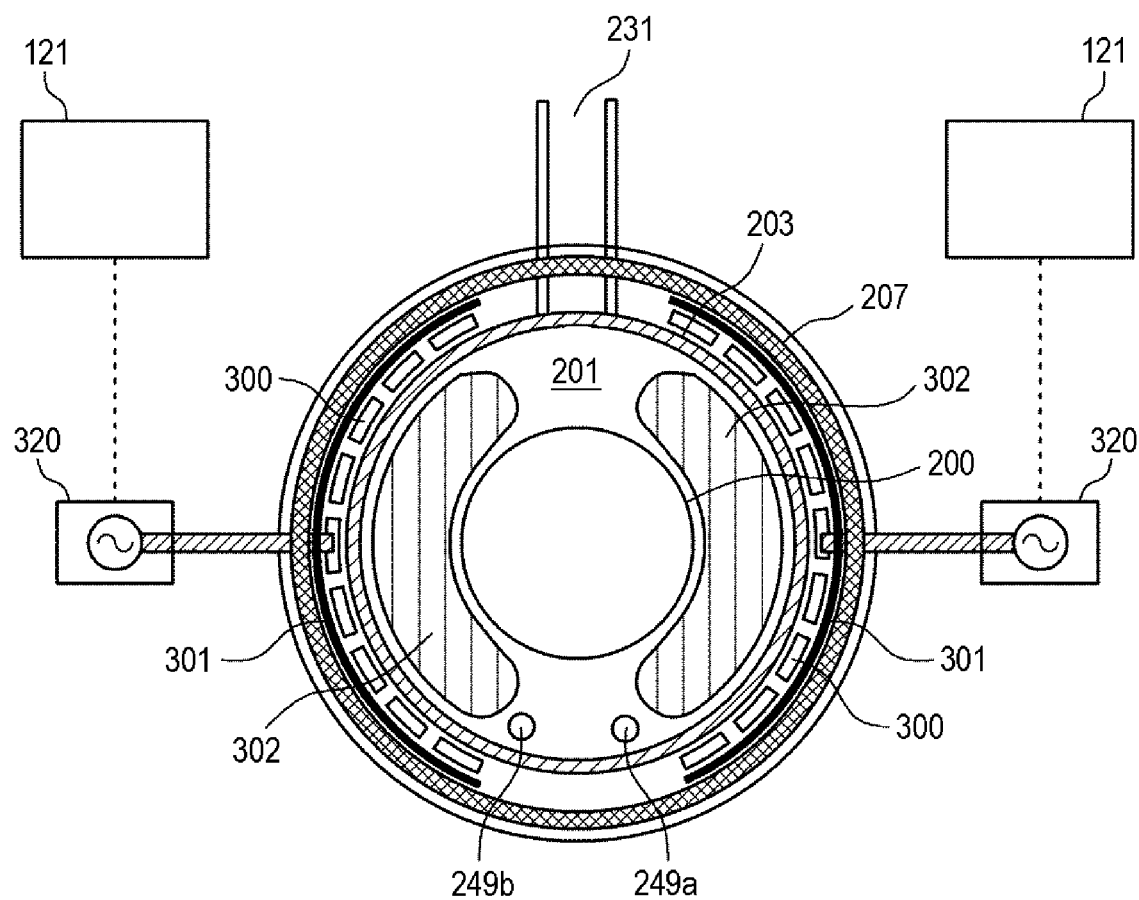
FIG. 2 is a cross-sectional view taken along line A-A in the substrate processing apparatus illustrated in FIG. 1.

As illustrated in FIG. 2, plasma is generated in the reaction tube 203 which is a vacuum partition wall made of quartz or the like at the time of supplying a reactant gas using capacitively coupled plasma (abbreviation: CCP).

Figure 3A:
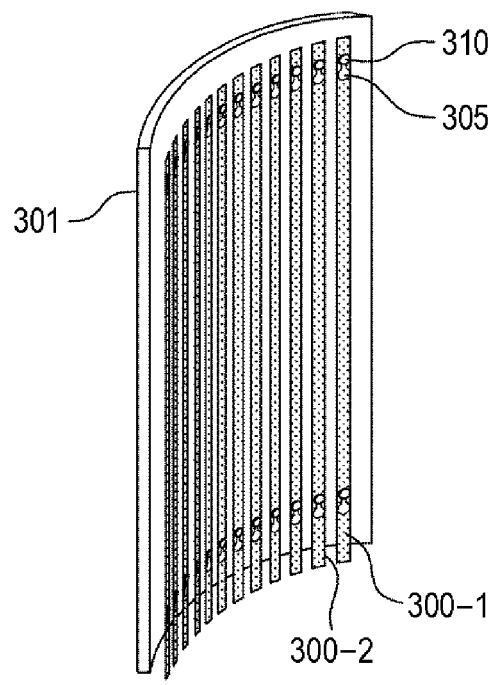
FIG. 3A is a perspective view when an external electrode of the embodiment of the present disclosure is disposed on a quartz cover.

As illustrated in FIGS. 2 and 3A, the external electrode 300 is made of a thin plate having a rectangular shape elongated in the arrangement direction of the wafers 200. In the external electrode 300, a first external electrode (Hot electrode) 300-1 to which a high-frequency power supply 320 is connected via a matching device (not illustrated) and to which an arbitrary potential is applied (an arbitrary voltage is applied) and a second external electrode (Ground electrode) 300-2 having a reference potential of 0 V and grounded are disposed at equal intervals. In the present disclosure, when it is not particularly necessary to distinguish the first external electrode 300-1 and the second external electrode 300-2 from each other, the first external electrode 300-1 and the second external electrode 300-2 are described as the external electrode 300.

The external electrode 300 is disposed between the reaction tube 203 and the heater 207, that is, in a substantially arc shape outside the process chamber 201 along an outer wall of the reaction tube 203, and is fixed to an inner wall surface of a quartz cover described later, formed in an arc shape, for example, so as to have a central angle of 30 degrees or more and 240 degrees or less. For example, a high frequency having a frequency of 13.56 MHz is input to the external electrode 300 from the high-frequency power supply 320 via a matching device (not illustrated), whereby plasma active species 302 are generated in the reaction tube 203 (process chamber 201). The plasma generated in this manner makes it possible to supply the plasma active species 302 for substrate processing from a periphery of the wafers 200 to surfaces of the wafers 200. The plasma generator is mainly configured by the external electrode 300 and the high-frequency power supply 320. A matching device (not illustrated) or the quartz cover 301 serving as an external electrode fixing jig described later may be included in the plasma generator.

The external electrode 300 can be made of a metal such as aluminum, copper, or stainless steel. However, when the external electrode 300 is made of an oxidation-resistant material such as nickel, it is possible to perform substrate processing while suppressing deterioration of electrical conductivity. In particular, when the external electrode 300 is made of a nickel alloy material to which aluminum is added, an AlO film which is an oxide film having high heat resistance and corrosion resistance is formed on an electrode surface. By an effect of the film formation, it is possible to suppress progress of deterioration into the electrode, and therefore it is possible to suppress a decrease in plasma generation efficiency due to a decrease in electrical conductivity.

Figure 4A:
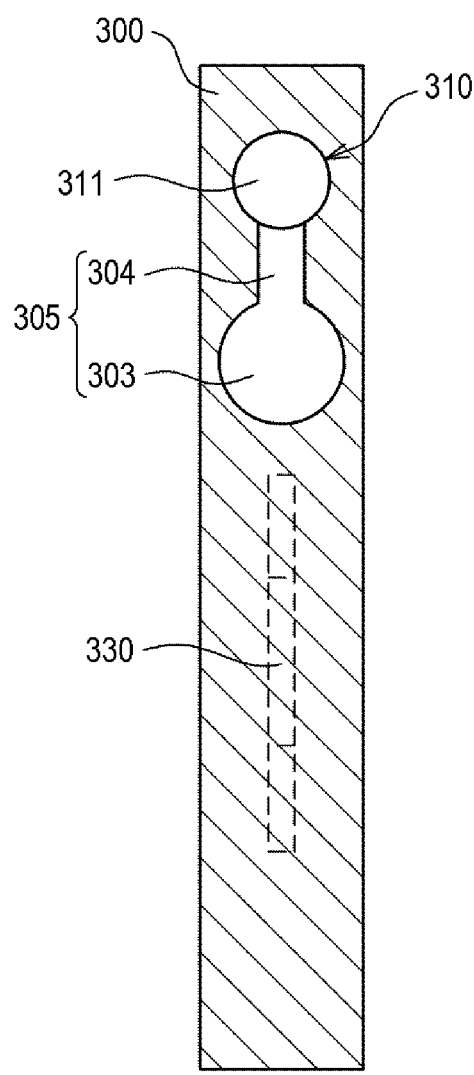
FIG. 4A is a front view of the external electrode of the embodiment of the present disclosure.

In addition, as illustrated in FIG. 4A, in the external electrode 300, a cutout portion 305 including a circular cutout portion 303 through which a protrusion head portion 311 described later passes and a slide cutout portion 304 that slides a protrusion shaft portion 312 is formed. The external electrode 300 is preferably configured to have sufficient strength, and to have a thickness of 0.1 mm or more and 1 mm or less and a width of 5 mm or more and 30 mm or less so as not to significantly lower efficiency of wafer heating by a heat source.

Figure 3B:
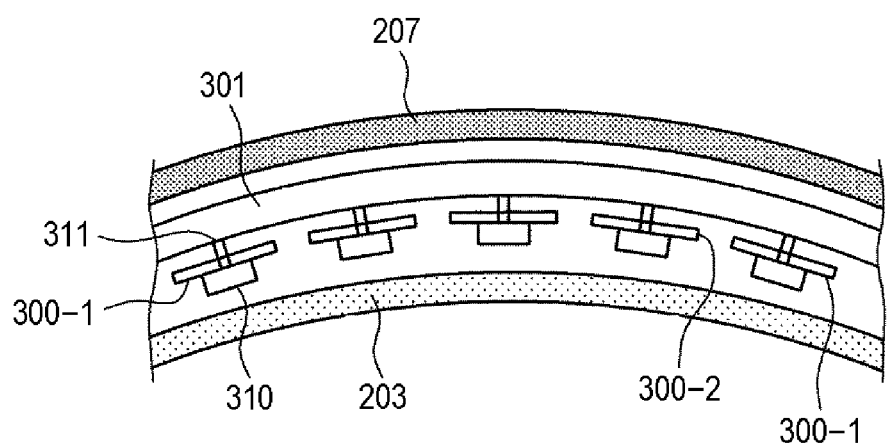
FIG. 3B is a diagram for illustrating a positional relationship among a heater, the quartz cover, the external electrode, a protrusion for fixing the external electrode, and a reaction tube of the embodiment of the present disclosure.

In a vertical substrate processing apparatus, the high-frequency power supply 320 was operated at a frequency of 13.56 MHz, an electrode having a length of 1 m, an electrode width of 10 mm, and a thickness of 1 mm was adopted, and a plurality of the first external electrodes 300-1 and a plurality of the second external electrodes 300-2 were arranged on an outer wall of a tubular reaction tube at an electrode pitch (center-to-center distance) of 20 mm in order of the first external electrode 300-1, the first external electrode 300-1, the second external electrode 300-2, the first external electrode 300-1, and the first external electrodes 300-1, . . . as illustrated in FIG. 3B to generate plasma in a CCP mode.

(External Electrode Fixing Jig)

Figure 4B:
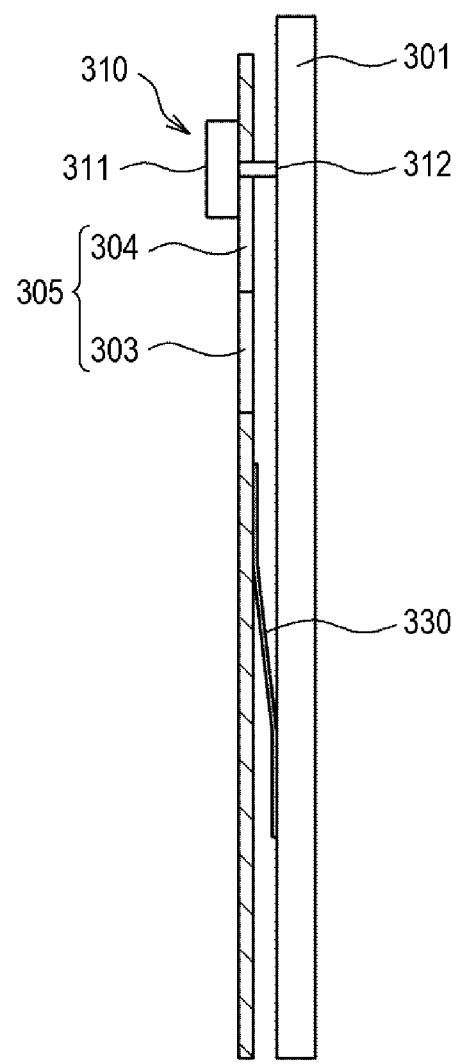
FIG. 4B is a diagram for explaining a point where the external electrode is fixed to the quartz cover.

Next, the quartz cover 301 serving as an external electrode fixing jig that fixes the external electrode 300 will be described with reference to FIGS. 3A and 4B. As illustrated in FIGS. 3A, 3B, 4A, and 4B, the plurality of external electrodes 300 is fixed by hooking the cutout portion 305 thereof on a protrusion 310 formed on an inner wall surface of the quartz cover 301 which is a curved external electrode fixing jig, and sliding the external electrodes 300, and unitized so as to be integrated with the quartz cover 301 (hook type external electrode unit) to be disposed on an outer periphery of the reaction tube 203. Here, the external electrode 300 and the quartz cover 301 which is an external electrode fixing jig are collectively referred to as an external electrode fixing unit. Note that quartz and a nickel alloy are adopted as materials of the quartz cover 301 and the external electrode 300, respectively.

The quartz cover 301 is preferably configured to have sufficient strength, and to have a thickness of 1 mm or more and 5 mm or less so as not to significantly lower efficiency of wafer heating by the heater 207. When the thickness of the quartz cover 301 is less than 1 mm, a predetermined strength against the weight of the quartz cover 301, a temperature change, and the like cannot be obtained. When the thickness is larger than 5 mm, the quartz cover 301 absorbs thermal energy emitted from the heater 207, and therefore a heat treatment to the wafers 200 cannot be appropriately performed.

The quartz cover 301 has a plurality of the protrusions 310 serving as rivet-shaped fixing portions for fixing the external electrodes 300 on an inner wall surface on the reaction tube side. The protrusion 310 includes the protrusion head portion 311 and the protrusion shaft portion 312. A maximum width of the protrusion head portion 311 is smaller than the diameter of the circular cutout portion 303 of the cutout portion 305 of the external electrode 300, and a maximum width of the protrusion shaft portion 312 is smaller than the width of the slide cutout portion 304. The cutout portion 305 of the external electrode 300 has a shape like a key hole, the slide cutout portion 304 can guide the protrusion shaft portion 312 during sliding, and the protrusion head portion 311 does not come off by the slide cutout portion 304. That is, it can be said that the external electrode fixing jig has a fixer including the protrusion head portion 311 which is a tip portion that suppresses the external electrode 300 from coming off from the protrusion shaft portion 312 which is a columnar portion to which the external electrode 300 is locked. Note that it is apparent that the shapes of the cutout portion 305 and the protrusion head portion 311 described above are not limited to the shapes illustrated in FIGS. 3A, 3B, 4A, and 4B as long as the external electrode 300 can be locked to the quartz cover 301. For example, the protrusion head portion 311 may have a protruding shape such as a hammer or a prickle.

In order to keep a distance between the quartz cover 301 or the reaction tube 203 and the external electrode 300 constant, an elastic body such as a spacer or a spring may be disposed therebetween, and the elastic body may have a structure integrated with the quartz cover 301 or the external electrode 300. In the present embodiment, a spacer 330 as illustrated in FIG. 4B has a structure integrated with the external electrode 300. It is more effective to dispose a plurality of the spacers 330 for one external electrode 300 in order to fix the external electrode 300 with a distance between the quartz cover 301 or the reaction tube 203 and the external electrode 300 constant.

In order to obtain high substrate processing ability at a substrate temperature of 500° C. or lower, the quartz cover 301 desirably has a substantially arc shape having a central angle of 30° or more and 240° or less as an occupancy thereof, and in order to avoid generation of particles, the quartz cover 301 is desirably disposed so as to avoid the exhaust pipe 231 which is an exhaust port, the nozzles 249a and 249b, and the like. That is, the quartz cover 301 which is an external electrode fixing jig is disposed on an outer periphery of the reaction tube 203 other than positions where the nozzles 249a and 249b which are gas suppliers disposed in the reaction tube 203 and the exhaust pipe 231 which is a gas exhauster are disposed. In the present embodiment, two quartz covers 301 having a central angle of 110° are disposed symmetrically.

(Spacer)

Next, the spacer 330 for fixing the external electrode 300 at a constant distance with respect to an outer wall of the quartz cover 301 which is an external electrode fixing jig or the reaction tube 203 will be described with reference to FIGS. 4A and 4B. For example, the spacer 330 is made of a cylindrical quartz material and integrated with the quartz cover 301, and abuts on the external electrode 300. As a result, the external electrode 300 is fixed to the quartz cover 301. As long as the external electrode 300 can be fixed at a constant distance with respect to the quartz cover 301 or the reaction tube 203, the external electrode 300 and the spacer 330 may be integrated with either the external electrode 300 or the quartz cover 301 in any form. For example, the spacer 330 may be made of a semi-cylindrical quartz material and integrated with the quartz cover to fix the external electrode 300, or the spacer 330 may be made of a metal plate material such as SUS and integrated with the external electrode 300 to fix the external electrode 300. Since the external electrode fixing jig and the spacer are disposed on the quartz cover, positioning of the external electrode 300 is facilitated, and when the external electrode 300 is deteriorated, only the external electrode 300 can be replaced, which reduces cost. Here, the spacer 330 may be included in the external electrode fixing unit described above.

(Auxiliary Plate)

Figure 5A:
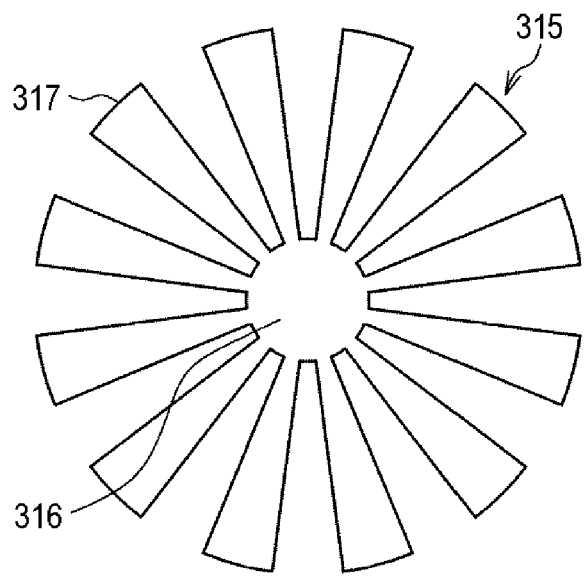
FIG. 5A is a front view of an auxiliary plate preferably used in the embodiment of the present disclosure.

Next, the auxiliary plate 315 will be described with reference to FIGS. 5A and 5B. As illustrated in FIG. 5A, for example, the auxiliary plate 315 is integrally configured by joining 12 fan-shaped fin plates 317 made of an insulating material (insulating member) such as SiC to a disk-shaped center plate 316 similarly made of an insulating material such as SiC. The fin plate 317 has a plate shape having the same thickness as the center plate 316, and is formed so as to extend radially from the center of the center plate 316. The auxiliary plate 315 is made of an insulating member, and therefore absorbs heat from the heater 207 and supplies radiant heat to the wafers 200. The center plate 316 has a diameter smaller than the wafer 200. The plurality of auxiliary plates 315 alternately disposed with the wafers 200 intensifies an electric field emitted from the external electrode 300 between the adjacent fin plates 317 to generate plasma, and assists generation of active species to increase the supply amount thereof near the center of a facing wafer 200. As a result, even if the surface area of the wafer 200 to be processed is significantly increased, the supply amount of active species such as ions and radicals generated by plasma is not insufficient with respect to a required amount, and processing ability is not deteriorated in the center portion of the wafer 200, that is, processing can be uniformly performed on the wafer 200. The plurality of fin plates 317 preferably has the same shape. The area between the fin plates 317 is preferably the same as or wider than the area of the fin plate 317. As a result, an area in which an electric field is generated can be ensured.

Figure 5B:
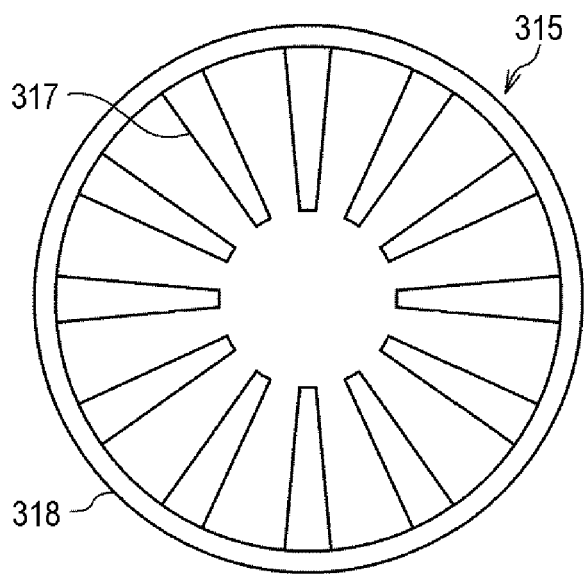
FIG. 5B is a front view of an auxiliary plate preferably used in another embodiment.

As illustrated in FIG. 5B, the auxiliary plate 315 may include a ring-shaped ring plate 318 having an outer diameter equivalent to the diameter of the wafer 200 and made of an insulating material (insulating member) such as SiC, and 12 fan-shaped fin plates 317 similarly made of an insulating material such as SiC.

Figure 6A:
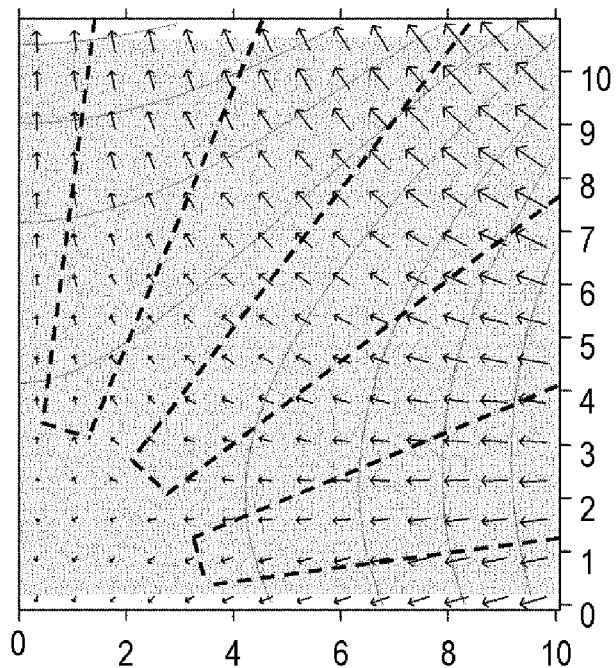
FIG. 6A is a distribution diagram of a potential (curve) and an electric field (arrow) when the auxiliary plate is not disposed.
Figure 6B:
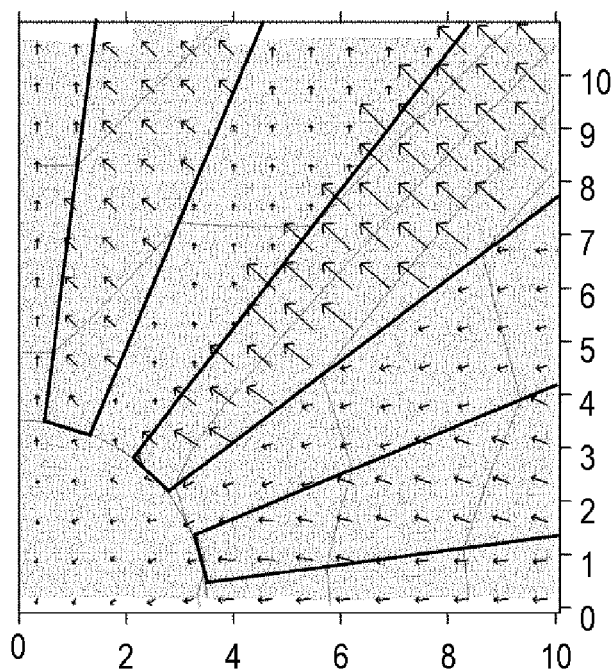
FIG. 6B is a distribution diagram of a potential (curve) and an electric field (arrow) when the auxiliary plate is disposed.

An example of electric field distribution at this time obtained by electromagnetic field analysis will be described with reference to FIGS. 6A and 6B. In a case where the auxiliary plate 315 is disposed as illustrated in FIG. 6B, an electric field near the center plate 316 is intensified (the size of the arrow is larger) than a case where the auxiliary plate 315 is not disposed as illustrated in FIG. 6A. The auxiliary plate 315 can absorb heat from the heater 207 and supply radiant heat to the wafers 200. Note that the number of fin plates 317 constituting one auxiliary plate 315 is not limited to 12 as long as the number is 4 or more and 20 or less, and the center portion of the center plate 316 may have a hollowed hole. The auxiliary plate 315 is preferably made of a material having high oxidation resistance, and SiO, SiN, GaO, GaN, AlO, AlN, ZrO, or the like may be used.

(Exhauster)

In the reaction tube 203, an exhaust pipe 231 that discharges an atmosphere in the process chamber 201 is disposed as illustrated in FIG. 1. To the exhaust pipe 231, a vacuum pump 246 serving as a vacuum exhaust device is connected via a pressure sensor 245 serving as a pressure detector that detects a pressure in the process chamber 201 and an auto pressure controller (APC) valve 244 serving as an exhaust valve (pressure regulator). The APC valve 244 is a valve configured to be able to perform vacuum exhaust and vacuum exhaust stop in the process chamber 201 by opening and closing the valve in a state where the vacuum pump 246 is operated, and furthermore, to be able to adjust a pressure in the process chamber 201 by adjusting the degree of valve opening based on pressure information detected by the pressure sensor 245 in a state where the vacuum pump 246 is operated. An exhaust system is mainly configured by the exhaust pipe 231, the APC valve 244, and the pressure sensor 245. The vacuum pump 246 may be included in the exhaust system. The exhaust pipe 231 does not have to be disposed in the reaction tube 203, and may be disposed in the manifold 209 similarly to the nozzles 249a and 249b.

Here, a pressure in the furnace during substrate processing is preferably controlled in a range of 10 Pa or more and 300 Pa or less. This is because when the pressure in the furnace is lower than 10 Pa, a mean free path of gas molecules is longer than the Debye length of plasma, plasma directly hitting a furnace wall is significant, and therefore it is difficult to suppress generation of particles. In addition, this is because when the pressure in the furnace is higher than 300 Pa, since plasma generation efficiency is saturated, even if a reactant gas is supplied, the generation amount of plasma does not change, the reactant gas is wastefully consumed, and at the same time, a mean free path of gas molecules is short, and transport efficiency of plasma active species to the wafers is thereby deteriorated.

(Peripheral Device)

Below the manifold 209, a seal cap 219 serving as a furnace lid capable of airtightly closing a lower end opening of the manifold 209 is disposed. The seal cap 219 is configured to abut on a lower end of the manifold 209 from a lower side in the vertical direction. The seal cap 219 is made of, for example, a metal such as SUS and is formed in a disk shape. On an upper surface of the seal cap 219, an O-ring 220b serving as a seal member abutting on the lower end of the manifold 209 is disposed.

On a side of the seal cap 219 opposite to the process chamber 201, a rotation mechanism 267 that rotates the boat 217 is disposed. A rotation shaft 255 of the rotation mechanism 267 penetrates the seal cap 219 and is connected to the boat 217. The rotation mechanism 267 is configured to rotate the wafer 200 by rotating the boat 217. The seal cap 219 is configured to be raised and lowered in the vertical direction by a boat elevator 115 serving as a raising/lowering mechanism vertically disposed outside the reaction tube 203. The boat elevator 115 is configured to be able to load the boat 217 into the process chamber 201 and unload the boat 217 out of the process chamber 201 by raising and lowering the seal cap 219.

The boat elevator 115 is configured as a transfer device (transfer mechanism) that transfers the boat 217, that is, the wafer 200 to the inside and the outside of the process chamber 201. Below the manifold 209, a shutter 219s serving as a furnace lid capable of airtightly closing a lower end opening of the manifold 209 while the seal cap 219 is lowered by the boat elevator 115 is disposed. The shutter 219s is made of, for example, a metal such as SUS and is formed in a disk shape. On an upper surface of the shutter 219s, an O-ring 220c serving as a seal member abutting on the lower end of the manifold 209 is disposed. An opening/closing operation (a raising/lowering operation, a rotation operation, or the like) of the shutter 219s is controlled by a shutter opening/closing mechanism 115s.

In the reaction tube 203, a temperature sensor 263 serving as a temperature detector is disposed. By adjusting a degree of energization to the heater 207 based on temperature information detected by the temperature sensor 263, the temperature in the process chamber 201 has desired temperature distribution. The temperature sensor 263 is disposed along an inner wall of the reaction tube 203 similarly to the nozzles 249a and 249b.

(Control Device)

Figure 7:
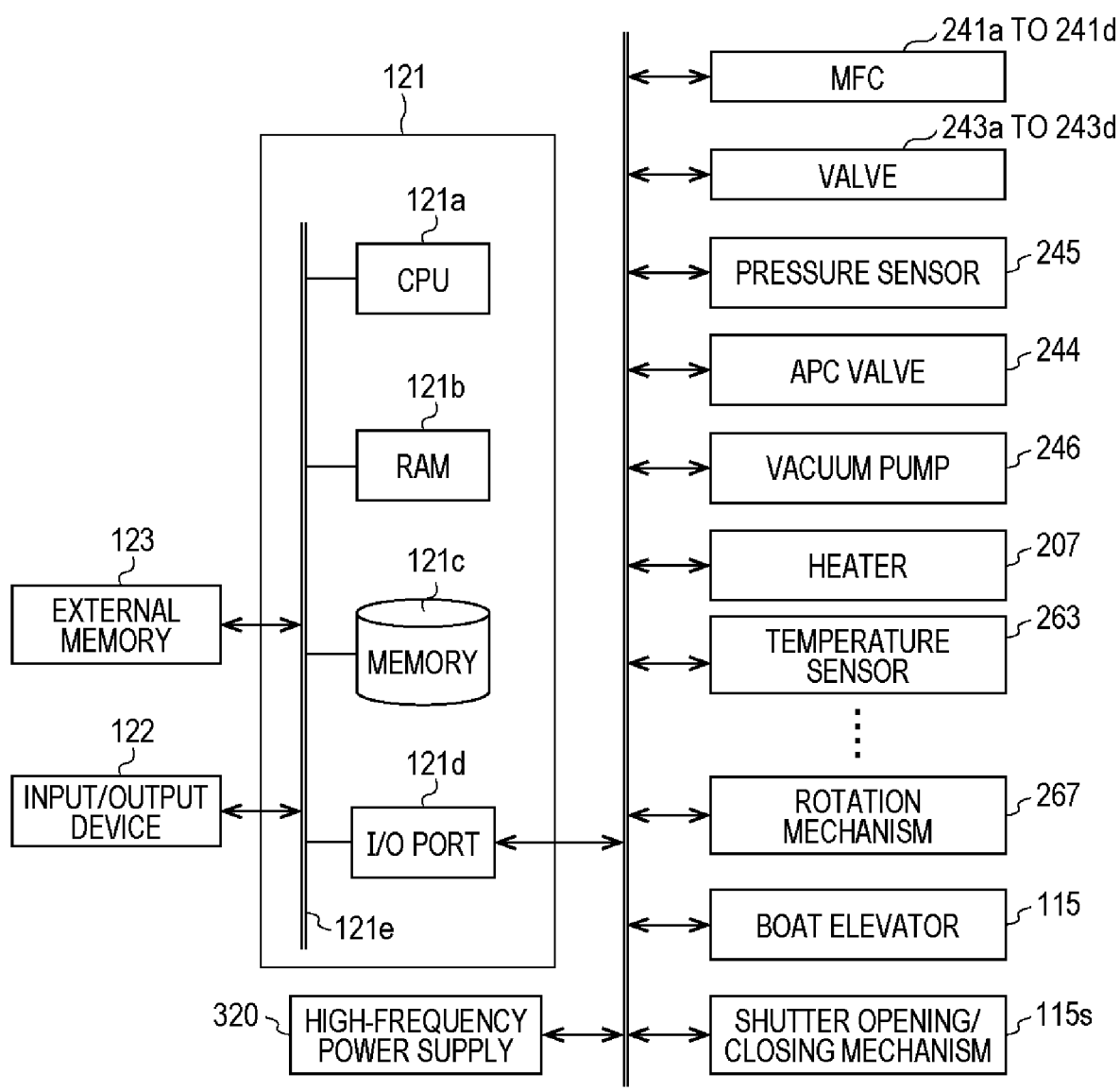
FIG. 7 is a schematic configuration diagram of a controller in the substrate processing apparatus illustrated in FIG. 1, and is a block diagram illustrating an example of a control system of the controller.

Next, a control device will be described with reference to FIG. 7. As illustrated in FIG. 7, a controller 121 which is a controller (control device) is configured as a computer including a central processing unit (CPU) 121a, a random access memory (RAM) 121b, a memory 121c, and an I/O port 121d. The RAM 121b, the memory 121c, and the I/O port 121d are configured to be able to exchange data with the CPU 121a via an internal bus 121e. To the controller 121, an input/output device 122 configured as, for example, a touch panel is connected.

The memory 121c is configured by, for example, a flash memory or a hard disk drive (HDD). In the memory 121c, a control program that controls an operation of the substrate processing apparatus, a process recipe in which procedures, conditions, and the like of film forming processing described later are described, and the like are readably stored. The process recipe is combined so as to cause the controller 121 to execute procedures in various types of processing (film forming processing) described later to obtain a predetermined result, and functions as a program. Hereinafter, the process recipe, the control program, and the like are also collectively and simply referred to as a program. In addition, the process recipe is also simply referred to as a recipe. In the present specification, the term "program" may include only the recipe alone, only the control program alone, or both of these. The RAM 121b is configured as a memory area (work area) in which programs, data, and the like read by the CPU 121a are temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, the shutter opening/closing mechanism 115s, the high-frequency power supply 320, and the like described above.

The CPU 121a is configured to read the control program from the memory 121c and execute the control program, and to read the recipe from the memory 121c in response to an input or the like of an operation command from the input/output device 122. The CPU 121a is configured to control the rotation mechanism 267, flow rate adjustment operations of various gases by the MFCs 241a to 241d, opening/closing operations of the valves 243a to 243d, an opening/closing operation of the APC valve 244, a pressure adjustment operation by the APC valve 244 based on the pressure sensor 245, start and stop of the vacuum pump 246, a temperature adjustment operation of the heater 207 based on the temperature sensor 263, operations of forward and reverse rotation of the boat 217, a rotation angle thereof, and a rotation speed adjustment thereof by the rotation mechanism 267, a raising/lowering operation of the boat 217 by the boat elevator 115, an opening/closing operation of the shutter 219s by the shutter opening/closing mechanism 115s, power supply of the high-frequency power supply 320, and the like according to the contents of the read recipe.

The controller 121 can be configured by installing the above-described program stored in an external memory (for example, a magnetic disk such as a hard disk, an optical disk such as a CD, a magneto-optical disk such as an MO, or a semiconductor memory such as a USB memory) 123 in a computer. The memory 121c and the external memory 123 are configured as computer-readable recording media. Hereinafter, these are collectively and simply referred to as a recording medium. In the present specification, the term "recording medium" may include only the memory 121c alone, only the external memory 123 alone, or both of these. Note that the program may be provided to the computer by using a communication means such as the Internet or a dedicated line without using the external memory 123.

(2) Substrate Processing Step

Figure 8:
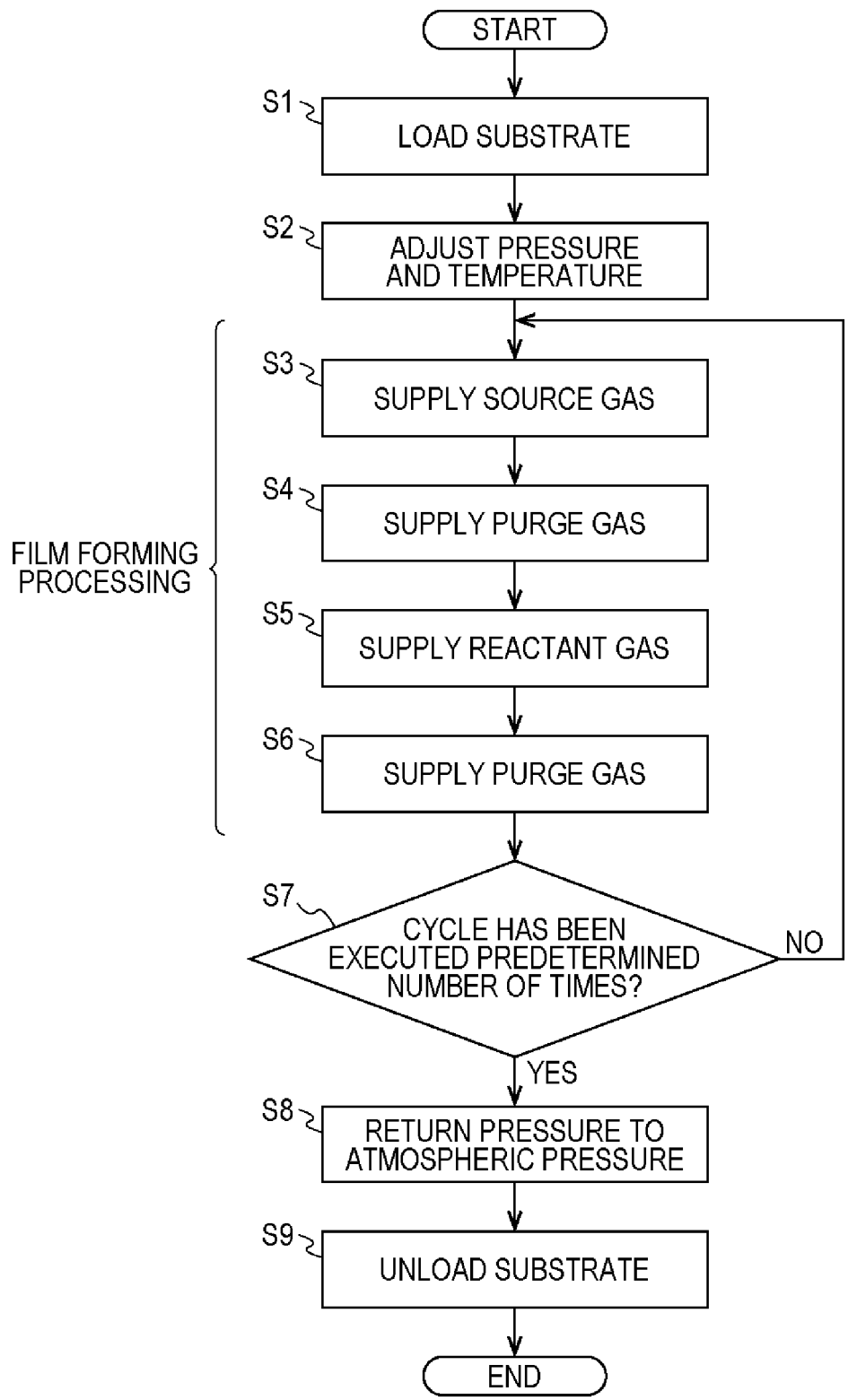
FIG. 8 is a flowchart illustrating an example of a substrate processing process using the substrate processing apparatus illustrated in FIG. 1.

A process example of forming a film on a substrate will be described with reference to FIG. 8 as one of semiconductor device (device) manufacturing steps using the substrate processing apparatus described above. In the following description, operations of the units constituting the substrate processing apparatus are controlled by the controller 121.

In the present specification, the sequence of the film forming processing illustrated in FIG. 8 may be illustrated as follows for convenience. Similar notation will be also used in description of the following modified example and other embodiment.

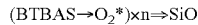

(BTBAS→O$_2$*)×n⇒SiO

In the present specification, the term "wafer" may mean "a wafer itself" or "a laminate (assembly) of a wafer and a predetermined layer, film, or the like formed on a surface of the wafer", that is, a wafer with a predetermined layer, film, or the like formed on a surface of the wafer may be referred to as a wafer. In the present specification, the term "surface of a wafer" may mean "a surface (exposed surface) of a wafer itself" or "a surface of a predetermined layer, film, or the like formed on a wafer, that is, an outermost surface of a wafer as a laminate".

Therefore, in the present specification, the description "supply a predetermined gas to a wafer" may mean "directly supply a predetermined gas to a surface (exposed surface) of a wafer itself" or "supply a predetermined gas to a layer, a film, or the like formed on a wafer, that is, to an outermost surface of a wafer serving as a laminate". In the present specification, the description "form a predetermined layer (or film) on a wafer" may mean "directly form a predetermined layer (or film) on a surface (exposed surface) of a wafer itself", or "form a predetermined layer (or film) on a layer, a film, or the like formed on a wafer, that is, on an outermost surface of a wafer serving as a laminate".

In the present specification, the term "substrate" is synonymous with the word "wafer".

(Loading Step: S1)

When the plurality of wafers 200 is mounted on the boat 217 (wafer charge), the shutter opening/closing mechanism 115s moves the shutter 219s to open a lower end opening of the manifold 209 (shutter open). Thereafter, as illustrated in FIG. 1, the boat 217 supporting the plurality of wafers 200 is raised by the boat elevator 115, and loaded into the process chamber 201 (boat load). In this state, the seal cap 219 is in a state of sealing a lower end of the manifold 209 via the O-ring 220b.

((Pressure and Temperature Adjustment Step: S2)

Vacuum exhaust (evacuation) is performed by the vacuum pump 246 such that the inside of the process chamber 201, that is, a space where the wafers 200 are present has a desired pressure (vacuum degree). At that time, the pressure in the process chamber 201 is measured by the pressure sensor 245, and the APC valve 244 is feedback-controlled based on the measured pressure information. The vacuum pump 246 maintains a state of being constantly operated at least until a film forming step described later is completed.

The wafers 200 in the process chamber 201 are heated by the heater 207 so as to have a desired temperature. At this time, the degree of energization to the heater 207 is feedback-controlled based on temperature information detected by the temperature sensor 263 such that the inside of the process chamber 201 has desired temperature distribution. Heating in the process chamber 201 by the heater 207 is continuously performed at least until the film forming step described later is completed. Note that when the film forming step is performed under a temperature condition of room temperature or lower, the inside of the process chamber 201 does not have to be heated by the heater 207. Note that when only processing under such a temperature is performed, the heater 207 is unnecessary, and the heater 207 does not have to be disposed in the substrate processing apparatus. In this case, the configuration of the substrate processing apparatus can be simplified.

Subsequently, rotation of the boat 217 and the wafers 200 is started by the rotation mechanism 267. The rotation of the boat 217 and the wafers 200 by the rotation mechanism 267 is continuously performed at least until the film forming step described later is completed.

(Film Forming Step: S3, S4, S5, and S6)

Thereafter, steps S3, S4, S5, and S6 are sequentially executed to perform the film forming step.

(Source Gas Supply Step: S3 and S4)

In step S3, a BTBAS gas is supplied to the wafers 200 in the process chamber 201.

The valve 243a is opened to allow the BTBAS gas to flow into the gas supply pipe 232a. The flow rate of the BTBAS gas is adjusted by the MFC 241a, and the BTBAS gas is supplied from the gas supply holes 250a into the process chamber 201 via the nozzle 249a, and is exhausted from the exhaust pipe 231. At this time, the BTBAS gas is supplied to the wafers 200. At this time, the valve 243c is simultaneously opened to cause a N$_2$ gas to flow in the gas supply pipe 232c. The flow rate of the N$_2$ gas is adjusted by the MFC 241c, and the N$_2$ gas is supplied together with the BTBAS gas into the process chamber 201, and is exhausted from the exhaust pipe 231.

In order to prevent the BTBAS gas from entering the nozzle 249b, the valve 243d is opened to cause a N$_2$ gas to flow into the gas supply pipe 232d. The N$_2$ gas is supplied into the process chamber 201 via the gas supply pipe 232d and the nozzle 249b and is exhausted from the exhaust pipe 231.

The supply flow rate of the BTBAS gas controlled by the MFC 241a is, for example, 1 sccm or more and 2000 sccm or less, and preferably 10 sccm or more and 1000 sccm or less. The supply flow rate of the N$_2$ gas controlled by each of the MFCs 241c and 241d is, for example, 100 sccm or more and 10000 sccm or less. As described above, the pressure in the process chamber 201 is, for example, 1 Pa or more and 2666 Pa or less, and preferably 67 Pa or more and 1333 Pa or less. Time for supplying the BTBAS gas to the wafers 200 is, for example, 1 second or more and 100 seconds or less, and preferably 1 second or more and 50 seconds or less.

The temperature of the heater 207 is set to a temperature at which the temperature of the wafers 200 is, for example, 0° C. or higher and 150° C. or lower, preferably room temperature (25° C.) or higher and 100° C. or lower, and more preferably 40° C. or higher and 90° C. or lower. The BTBAS gas is easily adsorbed on the wafers 200 and the like and highly reactive. Therefore, for example, even at a low temperature of about room temperature, the BTBAS gas can be chemically adsorbed on the wafers 200, and a practical film forming rate can be obtained. As in the present embodiment, by setting the temperature of the wafers 200 to 150° C. or lower, 100° C. or lower, or 90° C. or lower, the amount of heat applied to the wafers 200 can be reduced, and thermal history received by the wafers 200 can be favorably controlled. In addition, when the temperature of the wafers 200 is 0° C. or higher, BTBAS can be sufficiently adsorbed on the wafers 200, and a sufficient film forming rate can be obtained. Therefore, the temperature of the wafers 200 is 0° C. or higher and 150° C. or lower, preferably room temperature or higher and 100° C. or lower, and more preferably 40° C. or higher and 90° C. or lower.

By supplying the BTBAS gas to the wafers 200 under the above-described conditions, a Si-containing layer having a thickness of, for example, less than one atomic layer (one molecular layer) to about several atomic layers (several molecular layers) is formed on the wafer 200 (base film on a surface). The Si-containing layer may be a Si layer or an adsorption layer of BTBAS, or may include both of these.

The Si layer is a generic term including not only a continuous layer made of Si but also a discontinuous layer and a Si thin film formed by laminating these layers. Si constituting the Si layer includes Si in which a bond with an amino group is not completely cut and Si in which a bond with H is not completely cut.

The adsorption layer of BTBAS includes not only a continuous adsorption layer made of BTBAS molecules but also a discontinuous adsorption layer. The BTBAS molecule constituting the adsorption layer of BTBAS includes a molecule in which a bond between Si and an amino group is partially cut, a molecule in which a bond between Si and H is partially cut, a molecule in which a bond between N and C is partially cut, and the like. That is, the adsorption layer of BTBAS may be a physical adsorption layer of BTBAS or a chemical adsorption layer of BTBAS, or may include both of these.

Here, the layer having a thickness of less than one atomic layer (one molecular layer) means an atomic layer (molecular layer) discontinuously formed, and the layer having a thickness of one atomic layer (one molecular layer) means an atomic layer (molecular layer) continuously formed. The Si-containing layer may include both a Si layer and an adsorption layer of BTBAS. Note that, as described above, expressions such as "one atomic layer" and "several atomic layers" are used for the Si-containing layer, and the "atomic layer" is used synonymously with the "molecular layer".

Under conditions in which BTBAS self-decomposes (thermally decomposes), that is, under conditions in which a thermal decomposition reaction of BTBAS occurs, Si is deposited on the wafer 200 to form a Si layer. Under conditions in which BTBAS does not self-decompose (thermally decompose), that is, under conditions in which a thermal decomposition reaction of BTBAS does not occur, BTBAS is adsorbed on the wafer 200, whereby an adsorption layer of BTBAS is formed. Note that, in the present embodiment, since the temperature of the wafers 200 is set to a low temperature of, for example, 150° C. or lower, thermal decomposition of BTBAS hardly occurs. As a result, not the Si layer but the adsorption layer of BTBAS is more likely to be formed on the wafer 200.

When the thickness of the Si-containing layer formed on the wafer 200 exceeds several atomic layers, a modification action in modification processing described later does not reach the entire Si-containing layer. In addition, a minimum value of the thickness of the Si-containing layer that can be formed on the wafer 200 is less than one atomic layer. Therefore, the thickness of the Si-containing layer is preferably less than one atomic layer to about several atomic layers. By setting the thickness of the Si-containing layer to one atomic layer or less, that is, one atomic layer or less than one atomic layer, the modification action in the modification processing described later can be relatively enhanced, and time required for a modification reaction of the modification processing can be shortened. In addition, time required for forming the Si-containing layer in the film forming processing can also be shortened. As a result, processing time per cycle can be shortened, and total processing time can also be shortened. That is, the film forming rate can be increased. In addition, by setting the thickness of the Si-containing layer to one atomic layer or less, controllability of film thickness uniformity can also be enhanced.

After the Si-containing layer is formed, the valve 243a is closed to stop supply of the BTBAS gas into the process chamber 201. At that time, with the APC valve 244 opened, the inside of the process chamber 201 is vacuum-exhausted by the vacuum pump 246 to exhaust the unreacted BTBAS gas or the BTBAS gas after contributing to formation of the Si-containing layer remaining in the process chamber 201, a reaction by-product, and the like from the inside of the process chamber 201 (S4). In addition, with the valves 243c and 243d opened, supply of the $N_2$ gas into the process chamber 201 is maintained. The $N_2$ gas acts as a purge gas. Note that this step S4 may be omitted, and a source gas supply step may be performed.

As the source gas, in addition to the BTBAS gas, a tetrakis dimethylaminosilane ($Si[N(CH_3)_2]_4$, abbreviation: 4DMAS) gas, a tris dimethylaminosilane ($Si[N(CH_3)_2]_3H$, abbreviation: 3DMAS) gas, a bis dimethylaminosilane ($Si[N(CH_3)_2]_2H_2$, abbreviation: BDMAS) gas, a bis diethylaminosilane ($Si[N(C_2H_5)_2]_2H_2$, abbreviation: BDEAS) gas, or the like can be preferably used. In addition, as the source gas, various aminosilane source gases such as a dimethylaminosilane (DMAS) gas, a diethylaminosilane (DEAS) gas, a dipropylaminosilane (DPAS) gas, a diisopropylaminosilane (DIPAS) gas, a butylaminosilane (BAS) gas, and a hexamethyldisilazane (HMDS) gas, inorganic halosilane source gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, that is, silicon tetrachloride ($SiCl_4$, abbreviation: STC) gas, a hexachlorodisilane ($Si_2Cl_6$, abbreviation: HCDS) gas, and an octachlorotrisilane ($Si_3Cl_8$, abbreviation: OCTS) gas, and halogen group-free inorganic silane source gases such as a monosilane ($SiH_4$, abbreviation: MS) gas, a disilane ($Si_2H_6$, abbreviation: DS) gas, and a trisilane ($Si_3H_8$, abbreviation: TS) gas can be preferably used.

As the inert gas, in addition to the $N_2$ gas, a rare gas such as an Ar gas, a He gas, a Ne gas, or a Xe gas can be used.

(Reactant Gas Supply Step: S5 and S6)

After the film forming processing is completed, a plasma-excited $O_2$ gas serving as a reactant gas is supplied to the wafers 200 in the process chamber 201 (S5).

In this step, opening/closing control of the valves 243b to 243d is performed by a procedure similar to that of the opening/closing control of the valves 243a, 243c, and 243d in step S3. The flow rate of the $O_2$ gas is adjusted by the MFC 241b, and the $O_2$ gas is supplied from the gas supply holes 250b into the process chamber 201 via the nozzle 249b. At this time, high-frequency power (frequency 13.56 MHz in the present embodiment) is supplied (applied) from the high-frequency power supply 320 to the external electrode 300. The $O_2$ gas supplied into the process chamber 201 is excited to a plasma state in the process chamber 201, is supplied to the wafers 200 as active species (O*, $O_2$*, or $O_3$), and is exhausted from the exhaust pipe 231. Note that the $O_2$ gas excited to the plasma state is also referred to as oxygen plasma.

The supply flow rate of the $O_2$ gas controlled by the MFC 241b is, for example, 100 sccm or more and 10000 sccm or less. The high-frequency power applied from the high-frequency power supply 320 to the external electrode 300 is, for example, 50 W or more and 1000 W or less. The pressure in the process chamber 201 is, for example, 10 Pa or more and 300 Pa or less. By using plasma, the $O_2$ gas can be activated even when the pressure in the process chamber 201 is in such a relatively low pressure range. Time for supplying the active species obtained by plasma-exciting the $O_2$ gas to the wafers 200 is, for example, 1 second or more and 100 seconds or less, and preferably 1 second or more and 50 seconds or less. The other processing conditions are similar to those in step S3 described above.

Ions generated in oxygen plasma and electrically neutral active species oxidize the Si-containing layer formed on a surface of the wafer 200 as described later.

By supplying the $O_2$ gas to the wafer 200 under the above-described conditions, the Si-containing layer formed on the wafer 200 is plasma-oxidized. At this time, a Si—N bond and a Si—H bond of the Si-containing layer are cut by energy of the plasma-excited $O_2$ ₂gas. N and H whose bonds with Si are cut off, and C bonded to N are desorbed from the Si-containing layer. Then, Si having a dangling bond due to desorption of N or the like in the Si-containing layer is bonded to O contained in the $O_2$ gas to form a Si—O bond. As this reaction proceeds, the Si-containing layer is changed (modified) to a layer containing Si and O, that is, a silicon oxide layer (SiO layer).

Note that in order to modify the Si-containing layer into the SiO layer, it is necessary to supply a plasma-excited $O_2$ gas. This is because even if an $O_2$ gas is supplied under a non-plasma atmosphere, energy required for oxidizing the Si-containing layer is insufficient in the above-described temperature range, and it is difficult to sufficiently desorb N and C from the Si-containing layer or to sufficiently oxidize the Si-containing layer to increase the Si—O bond.

After the Si-containing layer is changed to the SiO layer, the valve 243b is closed to stop supply of the $O_2$ gas. In addition, supply of the high-frequency power to the external electrode 300 is stopped. Then, the $O_2$ gas and a reaction by-product remaining in the process chamber 201 are exhausted from the inside of the process chamber 201 by processing procedures and processing conditions similar to those in step S4 (S6). Note that this step S6 may be omitted, and a reactant gas supply step may be performed.

As the oxidizing agent, that is, the O-containing gas to be plasma-excited, in addition to the $O_2$ gas, a nitrous oxide ($N_2O$) gas, a nitrogen monoxide (NO) gas, a nitrogen dioxide ($NO_2$) gas, an ozone ($O_3$) gas, a hydrogen peroxide ($H_2O_2$) gas, water vapor ($H_2O$), an ammonium hydroxide ($NH_4(OH)$) gas, a carbon monoxide (CO) gas, a carbon dioxide ($CO_2$) gas, or the like may be used.

As the inert gas, in addition to the $N_2$ gas, for example, various rare gases exemplified in step S4 can be used.

(Predetermined Number of Times of Execution: S7)

One cycle is defined as performing the above-described steps S3, S4, S5, and S6 in this order non-simultaneously, that is, without synchronization, and this cycle is performed a predetermined number of times (n times), that is, once or more. As a result, a SiO film having a predetermined composition and a predetermined film thickness can be formed on the wafer 200. The above-described cycle is preferably repeated a plurality of times. That is, the thickness of the SiO layer formed per cycle is preferably made smaller than a desired film thickness, and the above-described cycle is preferably repeated a plurality of times until the film thickness of the SiO film formed by laminating the SiO layer reaches a desired film thickness.

(Step of Returning Pressure to Atmospheric Pressure: S8)

After completion of the film forming processing described above, a $N_2$ gas serving as an inert gas is supplied into the process chamber 201 from each of the gas supply pipes 232c and 232d and exhausted from the exhaust pipe 231. As a result, the inside of the process chamber 201 is purged with the inert gas, and the $O_2$ gas or the like remaining in the process chamber 201 is removed from the inside of the process chamber 201 (inert gas purge). Thereafter, the atmosphere in the process chamber 201 is replaced with the inert gas (inert gas replacement), and the pressure in the process chamber 201 is returned to a normal pressure (return to atmospheric pressure: S8).

(Unloading Step: S9)

Thereafter, the seal cap 219 is lowered by the boat elevator 115, a lower end of a manifold 209 is opened, and the processed wafers 200 are unloaded from the lower end of the manifold 209 to the outside of the reaction tube 203 in a state of being supported by the boat 217 (boat unload). After the boat unload, the shutter 219s is moved, and the lower end opening of the manifold 209 is sealed by the shutter 219s via the 0-ring 220c (shutter close). The processed wafers 200 are unloaded to the outside of the reaction tube 203 and then taken out from the boat 217 (wafer discharge). Note that after the wafer discharge, the empty boat 217 may be loaded into the process chamber 201.

Here, a pressure in the furnace during substrate processing is preferably controlled in a range of 10 Pa or more and 300 Pa or less. This is because when the pressure in the furnace is lower than 10 Pa, a mean free path of gas molecules is longer than the Debye length of plasma, plasma directly hitting a furnace wall is significant, and therefore it is difficult to suppress generation of particles. In addition, this is because when the pressure in the furnace is higher than 300 Pa, since plasma generation efficiency is saturated, even if a reactant gas is supplied, the generation amount of plasma does not change, the reactant gas is wastefully consumed, and at the same time, a mean free path of gas molecules is short, and transport efficiency of plasma active species to the wafers is thereby deteriorated.

(3) Effects of Present Embodiment

According to the present embodiment, one or more effects described below can be obtained.
(a) The auxiliary plate 315 introduced into a facing surface of the wafer 200 in the process chamber 201 intensifies an electric field emitted from the external electrode 300 between the adjacent fin plates 317 to generate plasma even near the center of the wafer 200.
(b) Generation of the plasma assists generation of active species to increase the supply amount thereof in the center portion of the wafer 200.
(c) Since the area between the fin plates 317 is the same as or larger than the area of the fin plate 317, an area in which an electric field is generated can be ensured.
(d) The auxiliary plate 315 is made of an insulating member, and therefore can absorb heat from the heater 207 and supply radiant heat to the wafer 200.

(e) By the actions (a) to (d) described above, even the wafer 200 having a large surface area can be subjected to uniform and high-quality processing.

The embodiment of the present disclosure has been specifically described above. However, the present disclosure is not limited to the above-described embodiment, and various modifications can be made without departing from the gist thereof.

In addition, for example, in the above-described embodiment, an example in which the reactant is supplied after the source is supplied has been described. The present disclosure is not limited to such an aspect, and the order of supplying the source and the reactant may be reversed. That is, the source may be supplied after the reactant is supplied. By changing the supply order, a film quality and a composition ratio of a film to be formed can be changed.

In the above-described embodiment and the like, an example in which a SiO film is formed on the wafer 200 has been described. The present disclosure is not limited to such an aspect, and is also preferably applicable to a case where a Si-based oxide film such as a silicon oxycarbide film (SiOC film), a silicon oxycarbonitride film (SiOCN film), or a silicon oxynitride film (SiON film) is formed on the wafer 200.

For example, by using a nitrogen (N)-containing gas such as an ammonia ($NH_3$) gas, a carbon (C)-containing gas such as a propylene ($C_3H_6$) gas, or a boron (B)-containing gas such as a boron trichloride ($BCl_3$) gas instead of the above-described gases or in addition to the above-described gases, a SiN film, a SiON film, a SiOCN film, a SiOC film, a SiCN film, a SiBN film, a SiBCN film, a BCN film, or the like can be formed. Note that the order of causing gases to flow can be appropriately changed. Also when these films are formed, film formation can be performed under processing conditions similar to those in the above-described embodiment, and effects similar to those in the above-described embodiment can be obtained. In these cases, the above-described reactant gas can be used as an oxidizing agent serving as a reactant gas.

In addition, the present disclosure is also preferably applicable to a case where a metal-based oxide film or a metal-based nitride film containing a metal element such as titanium (Ti), zirconium (Zr), hafnium (Hf), tantalum (Ta), niobium (Nb), aluminum (Al), molybdenum (Mo), or tungsten (W) is formed on the wafer 200. That is, the present disclosure is also preferably applicable to a case where a TiO film, a TiOC film, a TiOCN film, a TiON film, a TiN film, a TiSiN film, a TiBN film, a TiBCN film, a ZrO film, a ZrOC film, a ZrOCN film, a ZrON film, a ZrN film, a ZrSiN film, a ZrBN film, a ZrBCN film, a HfO film, a HfOC film, a HfOCN film, a HfON film, a HfN film, a HfSiN film, a HfBN film, a HfBCN film, a TaO film, a TaOC film, a TaOCN film, a TaON film, a TaN film, a TaSiN film, a TaBN film, a TaBCN film, a NbO film, a NbOC film, a NbOCN film, a NbON film, a NbN film, a NbSiN film, a NbBN film, a NbBCN film, an AlO film, an AlOC film, an AlOCN film, an AlON film, an AlN film, an AlSiN film, an AlBN film, an AlBCN film, a MoO film, a MoOC film, a MoOCN film, a MoON film, a MoN film, a MoSiN film, a MoBN film, a MoBCN film, a WO film, a WOC film, a WOCN film, a WON film, a WN film, a WSiN film, a WBN film, a WBCN film, or the like is formed on the wafer 200.

In these cases, for example, as the source gas, a tetrakis (dimethylamino) titanium ($Ti[N(CH_3)_2]_4$, abbreviation: TDMAT) gas, a tetrakis (ethylmethylamino) hafnium ($Hf[N(C_2H_5)(CH_3)]_4$, abbreviation: TEMAH) gas, a tetrakis (ethylmethylamino) zirconium ($Zr[N(C_2H_5)(CH_3)]_4$, abbreviation: TEMAZ) gas, a trimethylaluminum ($Al(CH_3)_3$, abbreviation: TMA) gas, or a titanium tetrachloride ($TiCl_4$) gas, a hafnium tetrachloride ($HfCl_4$) gas can be used.

That is, the present disclosure is preferably applicable to a case where a half metal-based film containing a half metal element or a metal-based film containing a metal element is formed. Processing procedures and processing conditions of the film forming processing can be similar to those of the film forming processing described in the above-described embodiment and modified example. Also in these cases, effects similar to those of the above-described embodiment can be obtained.

The recipe used in the film forming processing is preferably individually prepared according to processing contents and stored in the memory 121c via an electric communication line or the external memory 123. Then, when various types of processing is started, the CPU 121a preferably appropriately selects an appropriate recipe according to processing contents from among the plurality of recipes stored in the memory 121c. As a result, one substrate processing apparatus can generally form thin films of various film types, composition ratios, film qualities, and film thicknesses with favorable reproducibility. In addition, a burden on an operator can be reduced, and various types of processing can be promptly started while avoiding an operation error.

The above-described recipe is not limited to a newly created one, and may also be prepared, for example, by changing an existing recipe already installed in the substrate processing apparatus. When a recipe is changed, a changed recipe may be installed in the substrate processing apparatus via an electric communication line or a recording medium in which the recipe is recorded. In addition, an existing recipe already installed in the substrate processing apparatus may be directly changed by operating the input/output device 122 included in the existing substrate processing apparatus.

According to the present disclosure, it is possible to improve uniformity of substrate processing.

What is claimed is:

1. A substrate processing apparatus comprising:
a process chamber configured to process a plurality of substrates;
a substrate holder on which the plurality of substrates are supported;
an electrode configured to form plasma in the process chamber; and
auxiliary plate disposed between the plurality of substrates and configured to assist formation of the plasma, and
wherein the auxiliary plate includes a plurality of fin plates and one of a center plate having a diameter smaller than a diameter of each of the plurality of substrates or a ring-shaped ring plate having a diameter equivalent to a diameter of each of the plurality of substrates.

2. The substrate processing apparatus according to claim 1, wherein the auxiliary plate is disposed above each of the plurality of substrates.

3. The substrate processing apparatus according to claim 1, wherein the auxiliary plate includes the plurality of fin plates and the center plate and intensifies an electric field from the electrode by the plurality of fin plates to form plasma in the process chamber.

4. The substrate processing apparatus according to claim 1, wherein the auxiliary plate includes the plurality of fin plates and the ring-shaped ring plate and intensifies an electric field from the electrode by the plurality of fin plates to form plasma in the process chamber.

5. The substrate processing apparatus according to claim 1, wherein the auxiliary plate is made of a thermally insulating member.

6. The substrate processing apparatus according to claim 1, further comprising a heater configured to heat the plurality of substrates.

7. The substrate processing apparatus according to claim 6, wherein the auxiliary plate absorbs heat from the heater and supplies radiant heat to the substrates.

8. The substrate processing apparatus according to claim 1, wherein the auxiliary plate includes the plurality of fin plates and the center plate and the plurality of fin plates have the same shape.

9. The substrate processing apparatus according to claim 1, wherein the auxiliary plate includes the plurality of fin plates and the ring-shaped ring plate and the plurality of fin plates have the same shape.

10. The substrate processing apparatus according to claim 1, wherein the auxiliary plate includes the plurality of fin plates and the center plate and each of the plurality of fin plates has a fan shape.

11. The substrate processing apparatus according to claim 1, wherein the auxiliary plate includes the plurality of fin plates and the ring-shaped ring plate and each of the plurality of fin plates has a fan shape.

12. The substrate processing apparatus according to claim 1, wherein the auxiliary plate includes the plurality of fin plates and the center plate and an area between two of the plurality of fin plates is the same as or larger than an area of one of the plurality of fin plates.

13. The substrate processing apparatus according to claim 1, wherein the auxiliary plate includes the plurality of fin plates and the ring-shaped ring plate and an area between two of the fin plates is the same as or larger than an area of one of the plurality of fin plates.

14. The substrate processing apparatus according to claim 1, wherein the electrode is disposed outside the process chamber.

15. The substrate processing apparatus according to claim 6, wherein the electrode is disposed between the process chamber and the heater.

16. The substrate processing apparatus according to claim 1, wherein the electrode includes an electrode to which an arbitrary potential is applied and an electrode to which a reference potential is applied.

17. A substrate holder configured to support a plurality of substrates and a plurality of auxiliary plates configured to assist formation of plasma by an electrode such that each of the plurality of auxiliary plates is disposed between the plurality of substrates, and
   wherein the auxiliary plate includes a plurality of fin plates and one of a center plate having a diameter smaller than a diameter of each of the plurality of substrates or a ring-shaped ring plate having a diameter equivalent to a diameter of each of the plurality of substrates.

18. A method of manufacturing a semiconductor device, comprising:
   loading a substrate holder into a process chamber of a substrate processing apparatus including:
      the process chamber configured to process a plurality of substrates,
      the substrate holder on which the plurality of substrates is supported,
      an electrode configured to form plasma in the process chamber, and
      auxiliary plate disposed between the plurality of substrates and configured to assist formation of the plasma by the electrode,
      wherein the auxiliary plate includes a plurality of fin plates and one of a center plate having a diameter smaller than a diameter of each of the plurality of substrates or a ring-shaped ring plate having a diameter equivalent to a diameter of each of the plurality of substrates;
   supplying a gas into the process chamber; and
   generating plasma by the electrode and the auxiliary plate.

* * * * *